(12) United States Patent
Seo et al.

(10) Patent No.: US 7,785,664 B2
(45) Date of Patent: Aug. 31, 2010

(54) METHOD OF DEPOSITING THIN FILM

(75) Inventors: Tae Wook Seo, Suwon-si (KR); Young Hoon Park, Anseong-si (KR); Ki Hoon Lee, Yongin-si (KR); Sahng Kyoo Lee, Seoul (KR)

(73) Assignee: IPS Ltd., Pyungtaek-si (KR)

( * ) Notice: Subject to any disclaimer, the term of this patent is extended or adjusted under 35 U.S.C. 154(b) by 653 days.

(21) Appl. No.: 11/571,547

(22) PCT Filed: Dec. 14, 2005

(86) PCT No.: PCT/KR2005/004286

§ 371 (c)(1),
(2), (4) Date: Jan. 2, 2007

(87) PCT Pub. No.: WO2006/088284

PCT Pub. Date: Aug. 24, 2006

(65) Prior Publication Data

US 2008/0044567 A1 Feb. 21, 2008

(30) Foreign Application Priority Data

Feb. 18, 2005 (KR) .................... 10-2005-0013627

(51) Int. Cl.
*C23C 16/06* (2006.01)
*C23C 16/34* (2006.01)

(52) U.S. Cl. .............. 427/250; 427/255.394; 427/255.7; 427/534

(58) Field of Classification Search ............. 427/248.1, 427/250, 255.394, 255.7, 534
See application file for complete search history.

(56) References Cited

U.S. PATENT DOCUMENTS

| 5,514,257 | A | * | 5/1996 | Kobayashi et al. | ..... 204/192.17 |
| 5,582,881 | A | * | 12/1996 | Besser et al. | ................ 427/576 |
| 6,107,192 | A | * | 8/2000 | Subrahmanyan et al. | .... 438/637 |
| 6,203,674 | B1 | * | 3/2001 | Yamaguchi | ............ 204/192.22 |
| 6,217,721 | B1 | | 4/2001 | Xu et al. | |

(Continued)

OTHER PUBLICATIONS

Lin, Guoqiang, et al., "Factors Affecting Microhardness of Ti/TiN Multilayer Films Deposited by Pulsed Bias Arc Ion Plating". Plasma Processes and Polymers 4, S120-S123, 2007.*

(Continued)

*Primary Examiner*—Bret Chen
(74) *Attorney, Agent, or Firm*—Kile Goekjian Reed & McManus PLLC

(57) ABSTRACT

A method is provided for depositing thin films in which the thin films are continuously deposited into one chamber and 1-6 wafers are loaded into the chamber. In the method, a process gap between a shower head or a gas injection unit and a substrate is capable of being controlled. The method comprises (a) loading at least one substrate into the chamber, (b) depositing the Ti thin film onto the substrate, adjusted so that a first process gap is maintained, (c) moving a wafer block so that the first process gap is changed into a second process gap in order to control the process gap of the substrate upon which the Ti thin film is deposited, (d) depositing the TiN thin film onto the substrate, moved to set the second process gap, and (e) unloading the substrate upon which the Ti/TiN thin films are deposited.

23 Claims, 6 Drawing Sheets

U.S. PATENT DOCUMENTS

| | | | | |
|---|---|---|---|---|
| 6,274,500 B1 * | 8/2001 | Xuechun et al. | ............ | 438/706 |
| 6,579,730 B2 * | 6/2003 | Li et al. | ........................ | 438/14 |
| 6,652,718 B1 * | 11/2003 | D'Couto et al. | .......... | 204/192.3 |
| 6,673,716 B1 * | 1/2004 | D'Couto et al. | ............. | 438/656 |
| 6,787,006 B2 | 9/2004 | Gopalraja et al. | | |

OTHER PUBLICATIONS

Hu, J.C., et al., "Characterization of multilayered Ti/TiN films grown by chemical vapor deposition". Thin Solid Films 332 (1998), pp. 423-427.*

Inoue, Shozo, et al., "Preparation of compositionally gradient Ti-TiN films by r.f. reactive sputtering." Thin Solid Films 261 (1995), pp. 115-119.*

Wu, Wen-Fa, et al., "Novel Multilayered Ti/TiN Diffusion Barrier for Al Metallization". Journal of Electronic Materials, vol. 34, No. 8, 2005, pp. 1150-1156.*

PCT Written Opinion of the International Searching Authority; PCT/KR2005/004286; Date: Mar. 2, 2006.

PCT International Search Report; PCT/KR2005/004286; Date: Mar. 2, 2006 All the references cited in the Search Report are listed above.

* cited by examiner

[Fig. 1]

[Fig. 3]
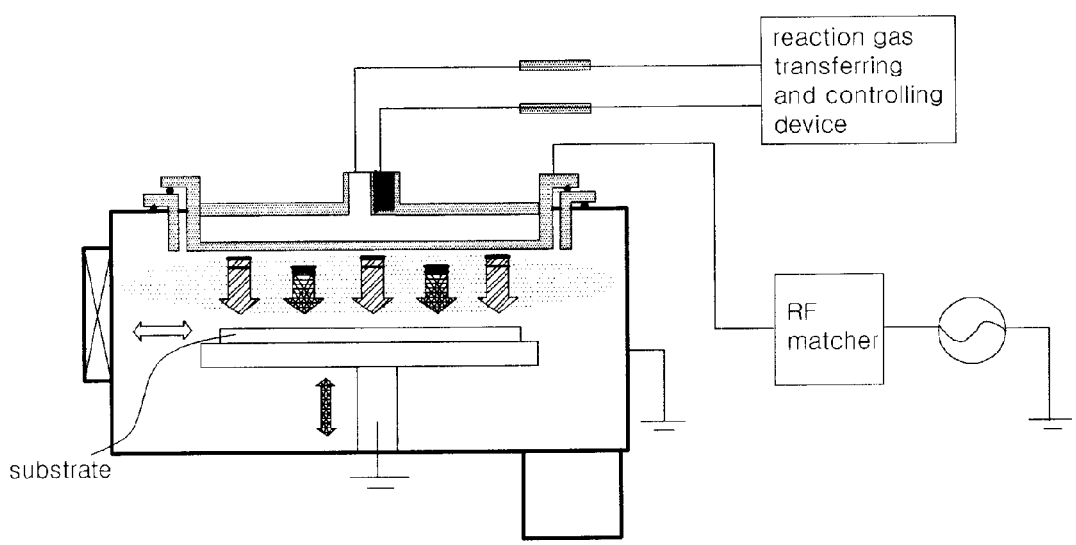
[Fig. 4]
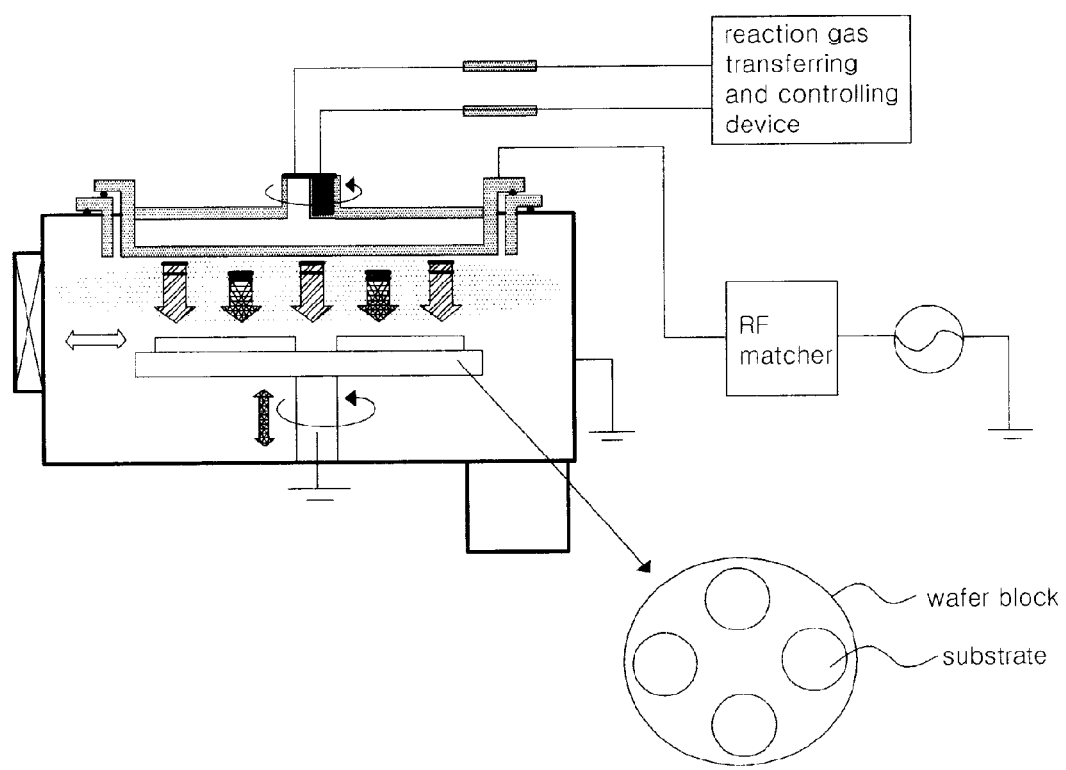

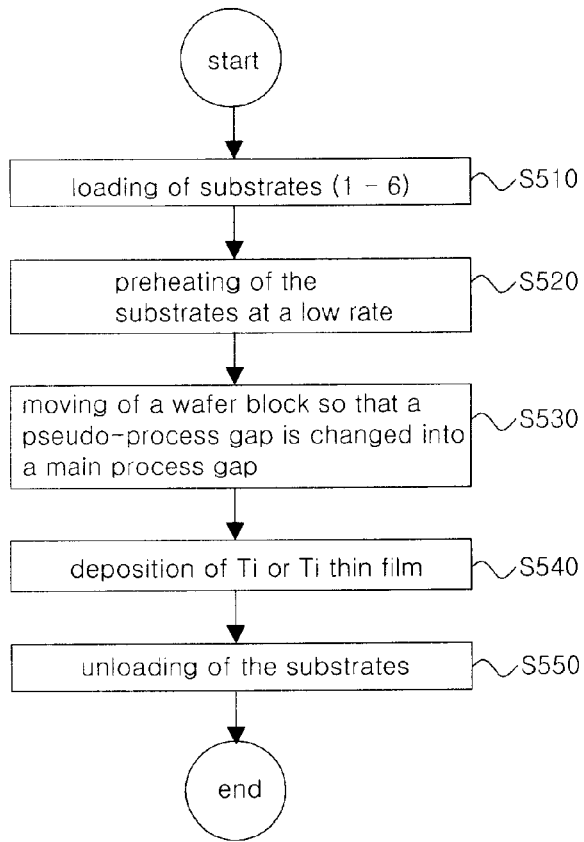
[Fig. 5]
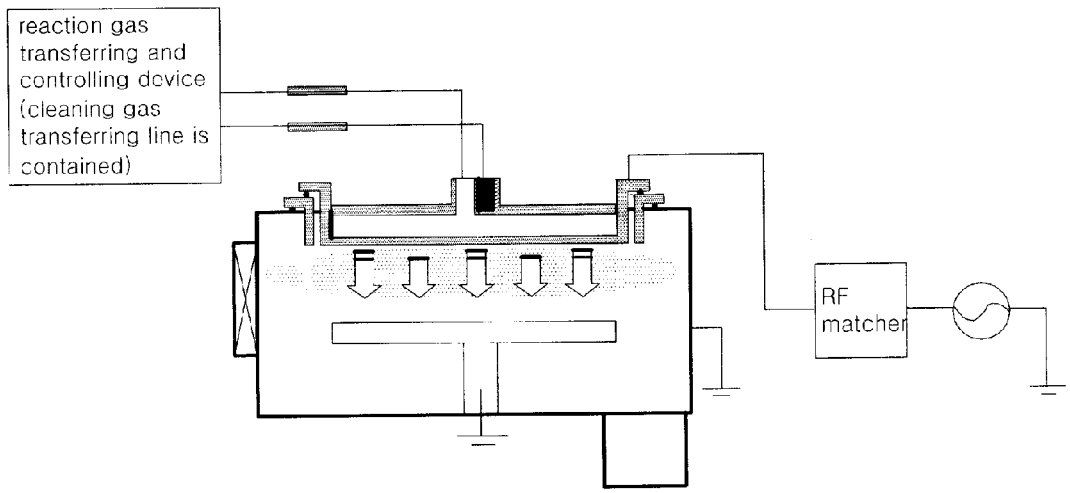
[Fig. 6]

[Fig. 7]
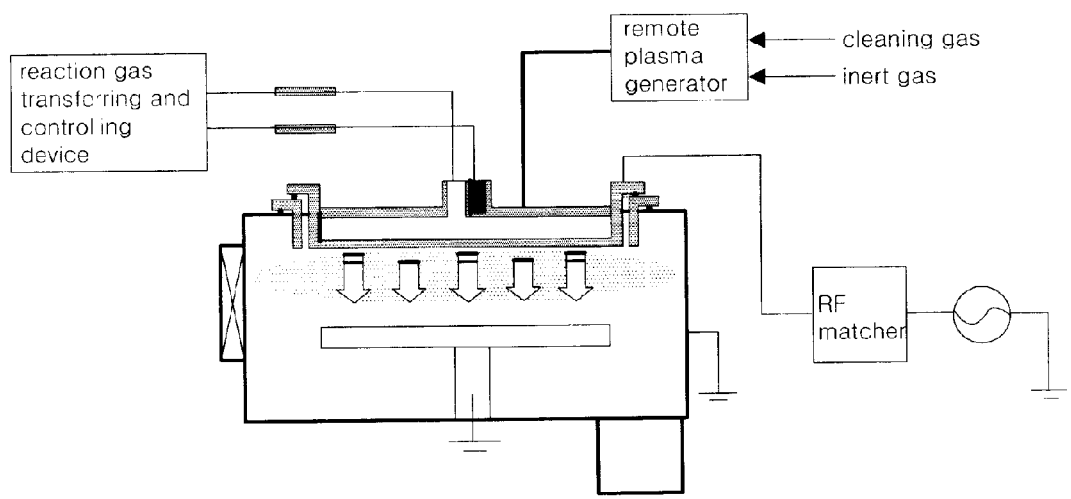
[Fig. 8]
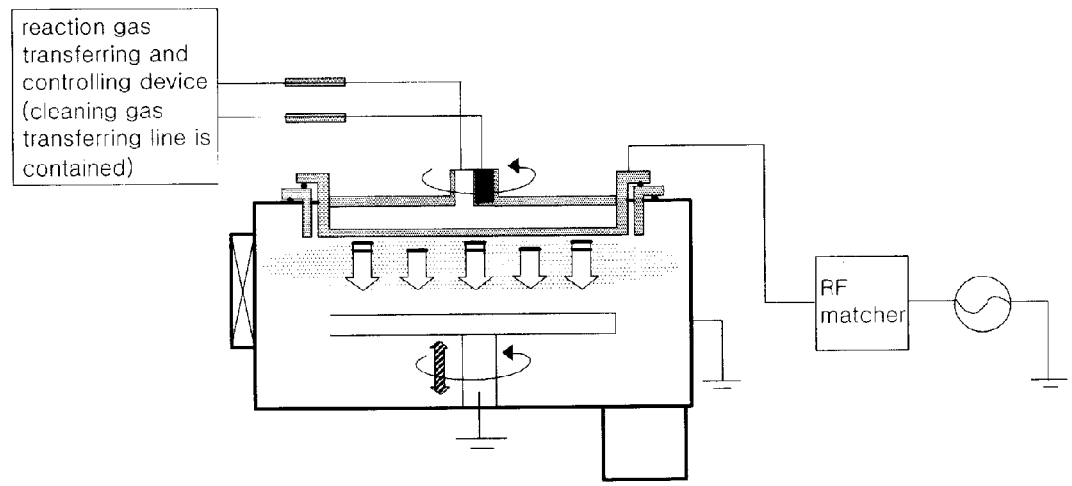

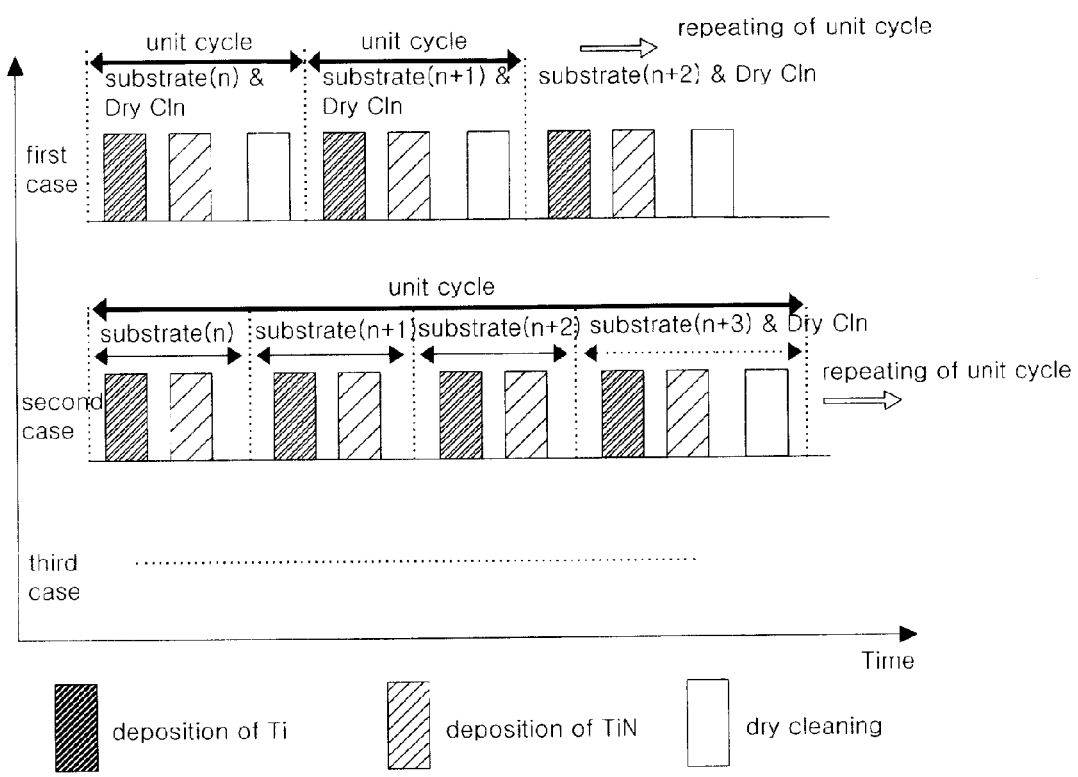
[Fig. 9]

METHOD OF DEPOSITING THIN FILM

TECHNICAL FIELD

The present invention relates, in general, to a method of depositing a thin film onto a substrate and, more particularly, to a method of depositing Ti/TiN thin films onto a substrate.

BACKGROUND ART

Currently, a chamber for depositing a Ti thin film and a chamber for depositing a TiN thin film are separately produced in the industry. Conventionally, in order to operate four Ti/TiN chambers, the Ti and TiN chambers are simultaneously subjected to a PM process in pairs, or the four Ti and TiN chambers are simultaneously subjected to the PM process.

DISCLOSURE OF INVENTION

Technical Problem

An object of the present invention is to provide a method of depositing thin films in which the thin films are continuously deposited into one chamber and 1-6 wafers are loaded into the chamber.

Technical Solution

In order to accomplish the above object, the present invention provides a method of depositing Ti/TiN thin films onto a substrate in a chamber for depositing a semiconductor thin film, in which a process gap between a shower head or a gas injection unit and the substrate is capable of being controlled. The method comprises (a) loading at least one substrate into the chamber, (b) depositing the Ti thin film onto the substrate, adjusted so that a first process gap is maintained, (c) moving a wafer block so that the first process gap is changed into a second process gap in order to control the process gap of the substrate upon which the Ti thin film is deposited, (d) depositing the TiN thin film onto the substrate, moved to set the second process gap, and (e) unloading the substrate upon which the Ti/TiN thin films are deposited.

Further, the present invention provides a method of depositing Ti/TiN thin films onto a substrate in a chamber for depositing a semiconductor thin film in which a process gap between a shower head or a gas injection unit and the substrate is capable of being controlled. The method comprises (a) loading at least one substrate into the chamber, (b) preheating the loaded substrate, (c) moving a wafer block so that a pseudo-process gap is changed into a main process gap, and (d) depositing the Ti/TiN thin films onto the preheated substrate.

Additionally, the present invention provides a method of depositing Ti/TiN thin films onto a substrate in a chamber for depositing a semiconductor thin film, in which a process gap between a shower head or a gas injection unit and the substrate is capable of being controlled. The method comprises (a) loading a Nth substrate (or a batch of substrates) into the chamber, (b) depositing the Ti thin film onto the substrate, adjusted so that a first process gap is maintained, (c) moving a wafer block, upon which the substrate is mounted, so that the first process gap is changed into a second process gap, (d) depositing the TiN thin film onto the substrate, moved to set the second process gap, (e) unloading the substrate upon which the Ti/TiN thin films are deposited, (f) repeating the steps (a) to (e) K times, (g) dry cleaning the chamber, and (h) loading a (N+1)th substrate (or a batch of substrates) into the chamber.

DESCRIPTION OF DRAWINGS

FIGS. 3 and 4 illustrate a chamber for depositing Ti/TiN thin films, according to the present invention;

FIG. 5 is a flowchart showing the deposition of Ti/TiN thin films, according to still another embodiment of the present invention;

FIG. 6 illustrates the dry cleaning in a chamber for depositing Ti/TiN thin films, according to an embodiment of the present invention;

FIG. 7 illustrates the dry cleaning in a chamber for depositing Ti/TiN thin films, according to another embodiment of the present invention;

FIG. 8 illustrates the dry cleaning in a chamber for depositing Ti/TiN thin films, according to still another embodiment of the present invention; and FIG. 9 illustrates cycles of dry cleaning conducted in a process of depositing Ti/TiN thin films, according to the present invention.

BEST MODE

Hereinafter, a detailed description will be given of the present invention, referring to the accompanying drawings.

Figure 1:
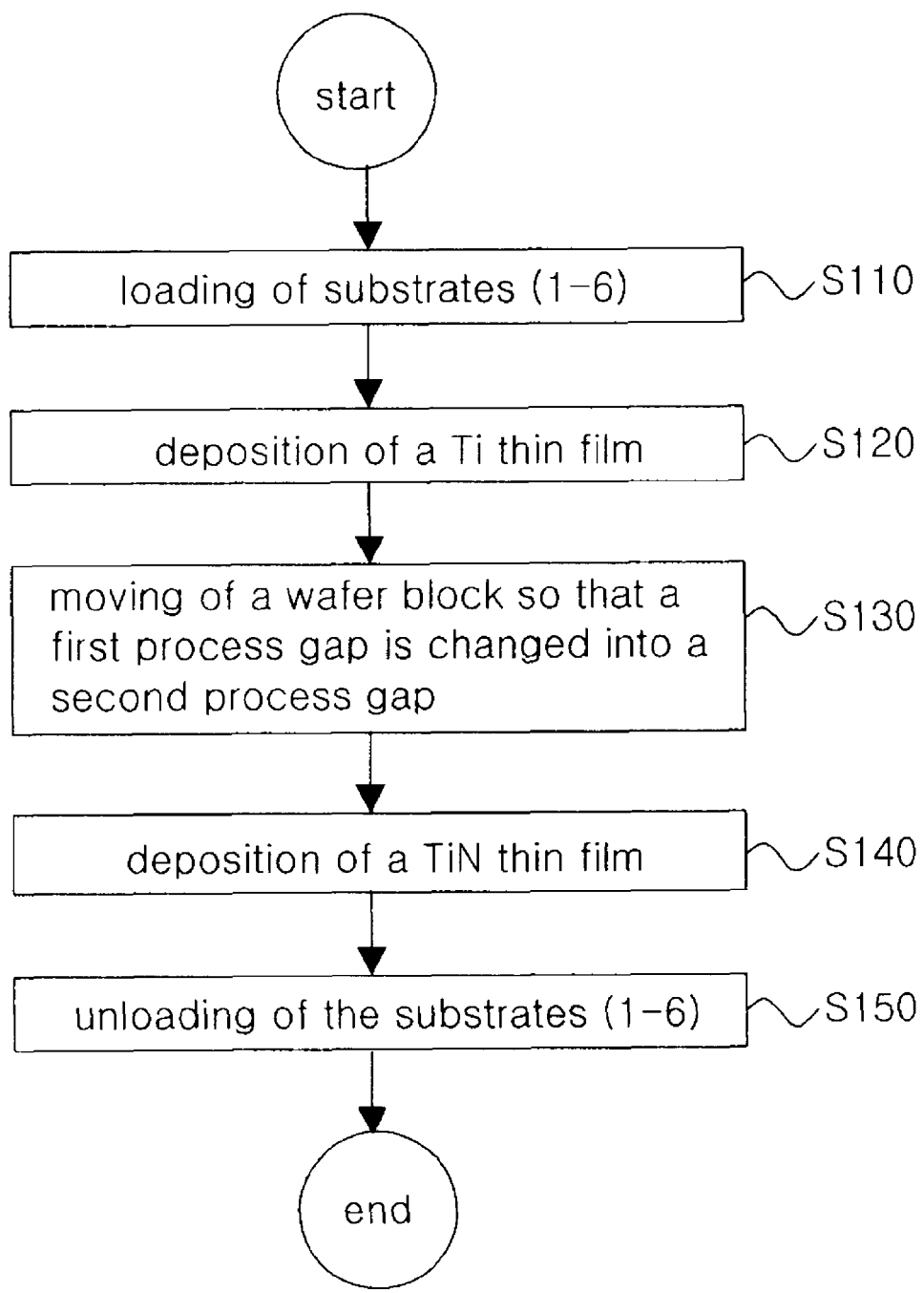
FIG. 1 is a flowchart showing the deposition of Ti/TiN thin films, according to an embodiment of the present invention.

FIG. 1 is a flowchart showing the deposition of Ti/TiN thin films, according to an embodiment of the present invention.

First, a substrate (1-6 substrates) is loaded into a chamber for depositing a semiconductor thin film, in which an gap between a shower head or a gas injection unit and the substrate (hereinafter, referred to as 'process gap') is capable of being controlled (S110).

A Ti thin film is deposited onto the substrate loaded in the chamber (S120). In connection with this, the gap between the shower head or gas injection unit and the substrate is maintained to be a first process gap.

A wafer block, on which the substrate is mounted, is moved so that the first process gap is changed into a second process gap (S130).

A TiN thin film is deposited onto the substrate (S140). In connection with this, the process gap is maintained to be the second process gap.

Finally, after the TiN thin film is deposited, the substrate (1-6 substrates) is unloaded (S150).

One of essential characteristics of the present invention is to apply optimum conditions to a process of continuously depositing the Ti thin film and the TiN thin film.

Generally, the process gap (the distance between the shower head or gas injection unit and the wafer block) is shorter in the process of depositing the Ti thin film than in the process of depositing the TiN thin film, in which only thermal cracking energy is used in order to apply electric energy using a power generator. In detail, the optimum process conditions for the deposition of the Ti and TiN thin films may not be derived from the same process gap.

In the present invention, the wafer block moves according to a Z-motion, 1-6 substrates are loaded, and the Ti thin film is deposited onto the substrate at the first process gap. Subsequently, the TiN thin film is deposited thereupon at the second process gap. In connection with this, the first process gap is set to be 1.5 times or less the second process gap.

In the process of depositing the Ti thin film, the process gap is set to about 30 mm or less. On the other hand, the TiN process gap is set to 70 mm or less. It is preferable that the TiN process gap be 25-70 mm if a CVD process is used. If the TiN thin film is deposited using a SLD (sequential layer deposition) process, the process gap is slightly reduced due to a purge effect.

In the process of depositing the Ti thin film, if the process gap is very wide, it is difficult to maintain a purity of the film. The reason is that it is difficult to reduce impurities in the film using a substitution reaction because an electric field is weakened even though power is not changed.

Additionally, if a difference in the process gap between the two processes is excessively large, a SH temperature change increases and productivity with respect to the number of proceeding substrates per unit time is reduced during the deposition of the Ti and TiN thin films.

A description will be given of a modified method of depositing Ti/TiN thin films in the chamber for depositing the semiconductor thin film, in which the gap (hereinafter, referred to as 'process gap') between the shower head or gas injection unit and the substrate is capable of being controlled, referring to FIG. 3.

In other words, in FIG. 1, a post-treatment step is interposed between a step of depositing the Ti thin film onto the substrate (S120) and a step of depositing the TiN thin film onto the substrate (S140).

The wafer block is moved so that the first process gap is changed into a first' process gap in order to conduct the post-treatment step after deposition of the Ti thin film, the Ti thin film is subjected to the post-treatment step, and the wafer block, upon which the substrate is mounted, is moved so that the first process gap is changed into the second process gap.

Subsequently, the TiN thin film is deposited. In connection with this, the gap between the shower head and the substrate is maintained to be the second process gap.

The post-treatment step is characterized in that one or more gases selected from the group consisting of He, Ar, N2, NH3, and H2 are blown to stabilize a surface of the Ti thin film.

Furthermore, at this stage, plasma may be generated. Ar as ignition gas, gas containing a H element, and gas containing a N element may be simultaneously blown to properly nitride an upper layer of the Tin thin film, thereby reducing impurities in the film and improving adhesive ability of the TiN film to be subsequently deposited thereupon.

As well, it is preferable that the first process gap be 1.5 times or less the second process gap and the first' process gap be 2 times or less the first process gap.

It is preferable to reduce the process gap in views of purity of the film during the process of depositing the Ti thin film, so as to reduce a deposition rate or specific resistance of the film. The reduction of the process gap may cause an increase in specific resistance depending on a power level.

However, if the process gap is excessively reduced exceeding a predetermined limit, hole marks are formed on the substrate due to injection of a steam source, thus the specific resistance is reduced. Meanwhile, after the deposition of Ti, a middle treatment step may be conducted while the gap is increased in comparison with the gap in the step of depositing the Ti thin film. Accordingly, it is preferable that the first' process gap be two times or less the first process gap. In the Ti process having the gap of about 30 mm or less, it is preferable that the gap be 60 mm or less in the middle treatment step.

Additionally, the step of depositing the TiN thin film (S140) further comprises a step of post-treating the TiN thin film. In the step of post-treating the TiN thin film, the process gap is the second' process gap, and the second' process gap is two times or less the second process gap. In connection with this, gas flow is more uniformly and stably formed on the substrate as the process gap is increased, thus the process gap is increased in the post-treatment step.

Meanwhile, in the step of depositing the Ti thin film (S120) or in the step of depositing the TiN thin film (S140), it is preferable to conduct the deposition while the wafer block, upon which the substrate is mounted, or the gas injection unit is rotated. If one substrate is used, there is no problem even if the wafer block or the gas injection unit is not rotated. However, if a plurality of substrates is used, it is very difficult to maintain a constant thickness, purity, and characteristics of the film deposited on the substrate. Accordingly, the rotation of the wafer block or the gas injection unit significantly contributes to improvement in deposition uniformity during deposition of the film even though this depends on the process conditions.

Figure 2:
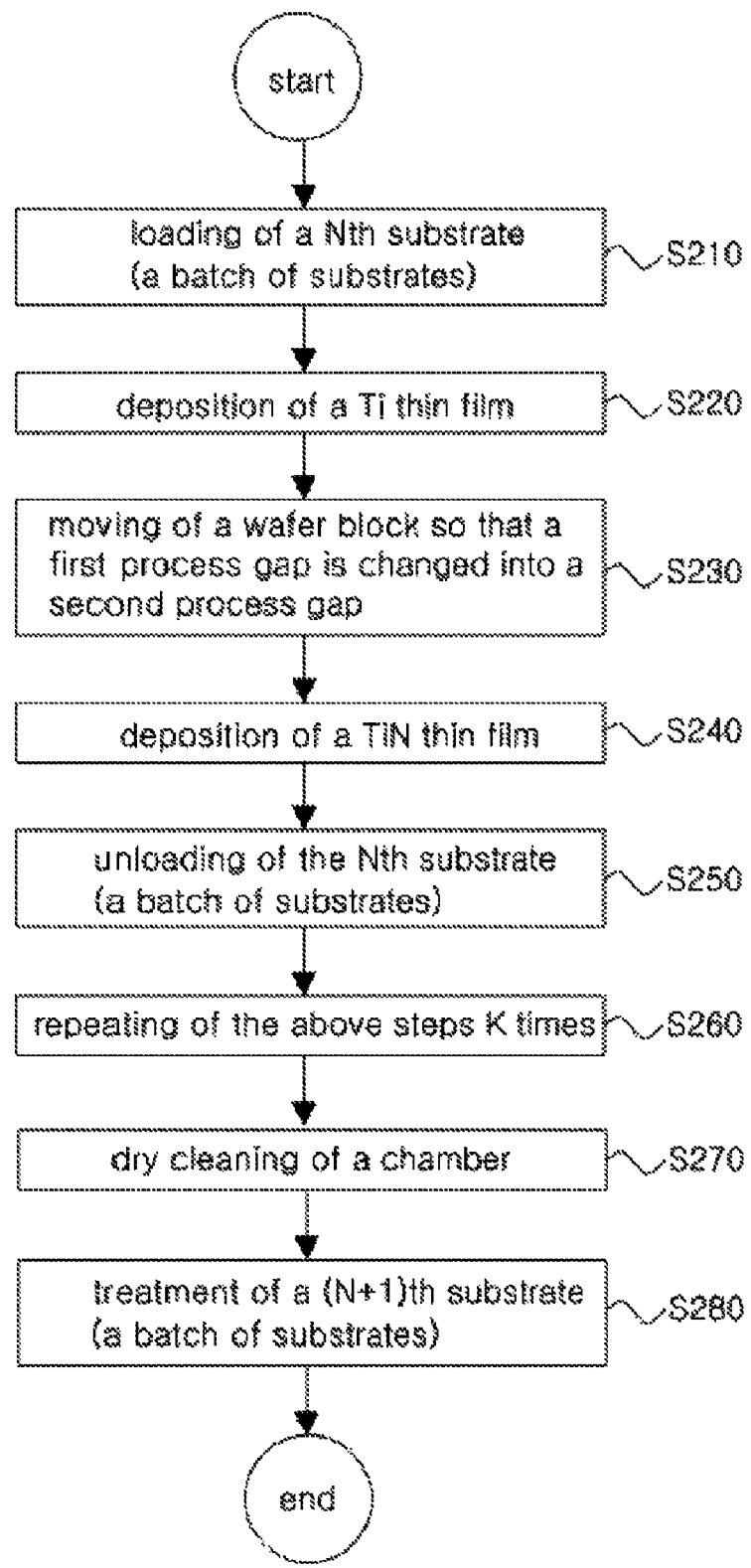
FIG. 2 is a flowchart showing the deposition of Ti/TiN thin films, according to another embodiment of the present invention.

FIG. 2 is a flowchart showing the deposition of Ti/TiN thin films, according to another embodiment of the present invention.

The deposition is conducted in a chamber for depositing a semiconductor thin film, in which an gap (hereinafter, referred to as 'process gap') between a shower head or a gas injection unit and a substrate is capable of being controlled, through the following procedure.

First, an Nth substrate or a batch of substrates (one batch=1-6 substrates) are loaded in the chamber (S210).

Second, a Ti thin film is deposited onto the substrate (S220). In connection with this, a first process gap is maintained during at least growth of the thin film.

Third, a wafer block, upon which the substrate is mounted, is moved so that the first to first' process gaps are changed into a second process gap (S230).

Fourth, a TiN thin film is deposited (S240). In connection with this, the second process gap is maintained during at least growth of the thin film.

Fifth, the Nth substrate or a batch of substrates are unloaded (S250).

Sixth, the first to fifth steps are repeated K times (K=0, 1, 2, ...) (S260).

Seventh, the chamber is subjected to a dry cleaning step (S270).

Eighth, the (N+1)th substrate or a batch of substrates are subjected to a Ti/TiN thin film deposition process (S280). In connection with this, the first process gap is 1.5 times or less the second process gap. The first' process gap is 2 times or less the first process gap. The first' process gap is a process gap in a post-treatment step in the course of depositing the Ti thin film.

A detailed description will be given of the dry cleaning step (S270), below.

Another essential characteristic of the present invention is a cyclic dry cleaning application and related technologies. Stability of the above-mentioned technologies controls success of a Ti/TiN continuous thin film deposition process.

A cleaning gas transferring line is additionally provided in a reaction gas transferring and controlling device in the dry cleaning step (S270), and the dry cleaning step (S270) comprises the following steps.

First, an gap between a wafer block and a shower head or a gas injection unit (hereinafter, referred to as 'cleaning gap') is controlled from a main process gap to a first cleaning gap. Subsequently, a mixture of cleaning gas and diluting gas (inert gas) is fed into the chamber so as to sufficiently clean an internal surface of the chamber. Next, the chamber is purged and/or remaining gas is removed.

Furthermore, in the dry cleaning step (S270), the purging of the chamber comprises injecting purge gas and stopping injection of the purge gas. The two steps are repeated.

Meanwhile, referring to FIGS. 5 and 6, the cleaning gas in the dry cleaning step is maintained in a plasma state due to electric energy applied to the shower head of the chamber.

After the flow of cleaning gas is completed, as unreacted dry cleaning gas and byproduct gases remain in the chamber for an extended period, it is necessary to purge the chamber for a desired period of time. However, in view of the internal geometry of the chamber, the internal shape of the chamber does not correspond to a smooth cyclic shape because a plurality of structures is mounted thereon. Accordingly, pumping and purging are repeated to increase efficiency of the exhaustion of remaining gas using a pulse purge. The purge gas, which is instantaneously supplied during the pumping, impacts a portion which is not easily purged due to the internal geometry of the chamber, thereby nicely purging the byproduct gases adsorbed therein.

FIG. 6 illustrates the direct application of electric energy to the shower head while the cleaning gas is blown to increase cleaning efficiency, and FIG. 7 illustrates use of a remote plasma generator, in which electric energy is not directly applied to the chamber.

The cleaning gas in the dry cleaning step (S270) is activated by the remote plasma generator provided at a path, through which the dry cleaning gas flows into the chamber, and is then fed into the chamber.

Particularly, in a NF3 remote plasma cleaning process, geometry of a shower head is structured so as to prevent energy from being significantly reduced when the activated dry cleaning gas flows through the S/H. In the above-mentioned process of FIG. 6, it is unnecessary to consider the problems of FIG. 7 with respect to geometry of the shower head, but in a direct plasma cleaning process, the wafer block and the chamber may be damaged when they are used for an extended period.

Meanwhile, referring to FIG. 8, in the dry cleaning step, the cleaning gas flows while the wafer block or the gas injection unit is rotated. As in the above-mentioned deposition process, rotation of the wafer block or the gas injection unit increases a centrifugal force of the cleaning gas injected against the wafer block and improves cleaning efficiency of the chamber.

In the dry cleaning step, it is preferable that the cleaning gas flow through at least two different cleaning gaps. That is to say, the cleaning step, which typically comprises soft and hard cleaning steps, is conducted using a predetermined gap, and then carried out while it comes in close proximity to the shower head. The cleaning gas is selected from the group consisting of F2, NF3, ClF3, BCl3, and Cl2.

With reference to FIG. 9, in a first case, dry cleaning is conducted for every one substrate or every one batch of substrates (1 batch=1-6 substrates). In a second case, the dry cleaning is conducted for every four substrates or every four batches of substrates. Productivity is increased as a dry cleaning cycle is long and a time of one dry cleaning cycle is short.

FIG. 5 is a flowchart showing the deposition of Ti/TiN thin films, according to still another embodiment of the present invention.

In FIG. 5, a preheating step is additionally conducted in order to deposit the Ti/TiN thin films more stably and rapidly. Thereby, it is easy to more rapidly heat the substrate upon the wafer block.

In other words, in FIG. 5, a step of loading the substrate (1-6 substrates) into the chamber (S510) and a step of pre-heating the substrate at a low rate (S520) are conducted. This means that the process gap is maintained to be a pseudo-process gap (the substrate and the wafer block are separated from each other at a predetermined gap).

The process of FIG. 5 comprises a step of moving the wafer block so that the pseudo-process gap is changed into a main process gap (S530), a step of depositing the Ti thin film or the TiN thin film (S540), a step of controlling the process gap to be the main process gap, and a step of unloading the substrate (1-6 substrates) (S550).

The step of preheating the substrate at a low rate (S520) has a more significant meaning in a case of using a substrate having a large diameter of 300 mm. It is as good as a substrate of 200 mm. The substrate is bent immediately when it is put onto the hot wafer block. After a sufficiently long time, the surface temperature of the substrate becomes uniform and it comes into uniform contact with the entire surface of the wafer block. However, if it is suddenly put onto the wafer block, the bending becomes more serious.

Therefore, the wafer block is not moved to a desired process height at a time, and the gap between the substrate and the wafer block is set to a predetermined gap, for example, 3 mm or less, to prevent the sudden bending. As well, it is preferable that a set temperature value of the wafer block not be changed in the course of depositing the Ti and TiN thin films.

Furthermore, after deposition of the Ti thin film is completed, when the wafer block is moved to deposit the TiN thin film, it is preferable to continuously inject purge gas from the shower head. The reason is that gases are injected from opposite sides through gas holes in the S/H to prevent the two gases from being mixed, causing a deposition reaction in the S/H, thereby effectively preventing formation of a powder film and occurrence of particles.

Meanwhile, in the process of preheating the substrate at a low rate, it is preferable that the chamber be fully pumped without injecting gas to the substrate at an early stage. The reason is as follows. Since a state in which the substrate is lifted from the wafer block using a wafer fin or other tools is more unstable than a state in which they are in contact with each other, if gas flows toward the substrate in the state in which the substrate is lifted from the wafer block, the substrate may be slightly swung and misalignedly mounted onto the wafer block.

Accordingly, in the step of preheating the substrate at a low rate (S520), it is preferable to inject a predetermined amount of gas toward the substrate after the chamber is fully pumped without injecting gas toward the substrate. Hence, the step of depositing the Ti or TiN thin film (S540) may further comprise preheating the substrate at a high rate while the substrate is in contact with the wafer block. In connection with this, the preheating at a high rate means that a lot of gas containing inert gas is blown toward the substrate so as to more rapidly heat the substrate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

According to the present invention, when it is possible to continuously deposit Ti/TiN thin films on 1-6 substrates in one chamber, it is possible to set only one chamber among 4 chambers in a PM period, thereby an operating ratio of a cluster tool can be significantly improved.

Furthermore, when Ti/TiN are continuously deposited in one chamber, the time needed to move the substrate from a Ti chamber to a TiN chamber is reduced, thus treatment efficiency of the substrate per unit time is significantly increased.

The invention claimed is:

1. A method of depositing Ti/TiN thin films onto a substrate in a chamber for depositing a semiconductor thin film, in which a process gap between a shower head or a gas injection unit and the substrate is capable of being controlled, comprising:
   (a) loading at least one substrate into the chamber;
   (b) depositing the Ti thin film onto the substrate, adjusted so that a first process gap is maintained, and moving the wafer block so that the first process gap is changed into a first' process gap and post-treating the Ti thin film to stabilize the Ti thin film before depositing the TiN thin film, wherein the first' process gap is selected to avoid the formation of hole marks on the substrate during the post-treating;
   (c) moving a wafer block so that the first process gap is changed into a second process gap in order to control the process gap of the substrate upon which the Ti thin film is deposited;
   (d) depositing the TiN thin film onto the substrate, moved to set the second process gap; and
   (e) unloading the substrate upon which the Ti/TiN thin films are deposited.

2. The method as set forth in claim 1, wherein the first process gap is 1.5 times or less the second process gap.

3. The method as set forth in claim 1, wherein the post-treating is conducted by stabilizing a surface of the Ti thin film while one or more gases selected from a group consisting of He, Ar, N2, NH3, and H2 are blown, thereon.

4. The method as set forth in claim 1, wherein the first' process gap is two times or less the first process gap.

5. The method as set forth in claim 1, wherein the step (d) further comprises post-treating the TiN thin film so that the process gap is a second' process gap and the second' process gap is two times or less the second process gap.

6. The method as set forth in claim 1, wherein the steps (b) and (d) are conducted by depositing the Ti/TiN thin films while the wafer block or the gas injection unit is rotated when a plurality of substrates is mounted upon the wafer block.

7. The method as set forth in claim 1, wherein a set temperature value of the wafer block is not changed.

8. The method as set forth in claim 1, wherein, after the Ti thin film is deposited, purge gas is continuously injected from the shower head when the wafer block is moved to begin deposition of the TiN thin film.

9. A method of depositing Ti/TiN thin films onto a substrate in a chamber for depositing a semiconductor thin film, in which a process gap between a shower head or a gas injection unit and the substrate is capable of being controlled, comprising:
   (a) loading at least one substrate into the chamber;
   (b) preheating the loaded substrate;
   (c) moving a wafer block so that a pseudo-process gap is changed into a main process gap;
   (d) depositing the Ti thin film onto the preheated substrate adjusted so that the main process gap is maintained;
   (e) moving the wafer block so that the main process gap is changed into a first' process gap and post-treating the Ti thin film to stabilize the Ti thin film before depositing the TiN thin film, wherein the first' process gap is selected to avoid the formation of hole marks on the substrate during the post-treating; and
   (f) moving the wafer block to the main process gap and depositing the TiN thin film onto the preheated substrate adjusted to the main process gap is maintained.

10. The method as set forth in claim 9, wherein in the step (b), the wafer block is positioned at the pseudo-process gap such that the substrate and the wafer block are separated from each other by the predetermined pseudo-process gap.

11. The method as set forth in claim 9, wherein the step (b) comprises: (b1) fully pumping the chamber without injecting gas toward the substrate; and (b2) injecting a predetermined amount of gas toward the substrate.

12. The method as set forth in claim 9, wherein the step (b) comprises blowing a sufficient amount of gas containing inert gas toward the substrate in order to more rapidly heat the substrate.

13. The method as set forth in claim 9, wherein a set temperature value of the wafer block is not changed.

14. The method as set forth in claim 9, wherein the step (e), after the Ti thin film is deposited, purge gas is continuously injected from the shower head when the wafer block is moved to begin deposition of the TiN thin film.

15. A method of depositing Ti/TiN thin films onto a substrate in a chamber for depositing a semiconductor thin film, in which a process gap between a shower head or a gas injection unit and the substrate is capable of being controlled, comprising:
   (a) loading a Nth single substrate or a Nth batch of substrates into the chamber;
   (b) depositing the Ti thin film onto the substrate, adjusted so that a first process gap is maintained;
   (c) moving a wafer block upon which the substrate is mounted so that the first process gap is changed into a first' process gap, and post-treating the Ti thin film to stabilize the Ti thin film before depositing the TiN thin film, wherein the first' process gap is selected to avoid the formation of hole marks on the substrate during the post-treating;
   (d) moving the wafer block so that the first' process gap is changed into a second process gap;
   (e) depositing the TiN thin film onto the substrate, moved to set the second process gap;
   (f) unloading the substrate upon which the Ti/TiN thin films are deposited;
   (g) repeating the steps (a) to (e) K times;
   (h) dry cleaning the chamber; and
   (i) loading a (N+1)th single substrate or a (N+1)th batch of substrates into the chamber.

16. The method as set forth in claim 15, wherein a cleaning gas transferring line is provided in a reaction gas transferring and controlling device in the dry cleaning of the chamber, the dry cleaning comprising:
   (h1) controlling an gap between the wafer block and the shower head so that a main process gap is changed into a first cleaning gap;
   (h2) feeding a mixture of cleaning gas and diluting gas (inert gas) into the chamber so as to desirably clean an internal surface of the chamber; and
   (h3) purging the chamber and/or removing remaining gases.

17. The method as set forth in claim 16, wherein the cleaning gas is maintained in a plasma state due to electric energy applied to the shower head of the chamber.

18. The method as set forth in claim 17, wherein the cleaning gas is selected from a group consisting of fluorine (F2), nitrogen trifluoride (NF3) gas, chlorine trifluoride (ClF3), boron trichloride (BCl3), and chlorine (Cl2).

19. The method as set forth in claim 16, wherein the cleaning gas is activated by a remote plasma generator provided at a path, through which dry cleaning gas flows into the chamber, and then fed into the chamber.

20. The method as set forth in claim 19, wherein the cleaning gas is selected from a group consisting of fluorine (F2), nitrogen trifluoride (NF3) gas, chlorine trifluoride (ClF3), boron trichloride (BCl3), and chlorine (Cl2).

21. The method as set forth in claim 16, wherein the purging of the chamber comprises:

(h31) injecting purge gas; and (h32) stopping the injection of the purge gas, the (h31) and (h32) steps being repeated.

22. The method as set forth in claim 16, wherein the feeding of the mixture is conducted using at least two different cleaning gaps.

23. The method as set forth in claim 16, wherein the feeding of the mixture is conducted while the wafer block or the gas injection unit is rotated.

* * * * *